(12) United States Patent
Chetcuti et al.

(10) Patent No.: US 9,218,945 B2
(45) Date of Patent: Dec. 22, 2015

(54) MAGNETRON WITH GRADUALLY INCREASING MAGNETIC FIELD OUT OF TURNAROUNDS

(75) Inventors: Fred Chetcuti, Millbrae, CA (US); Edward J. McInerney, San Jose, CA (US)

(73) Assignee: APOLLO PRECISION BEIJING LIMITED, Beijing (CN)

( * ) Notice: Subject to any disclaimer, the term of this patent is extended or adjusted under 35 U.S.C. 154(b) by 751 days.

(21) Appl. No.: 13/323,241

(22) Filed: Dec. 12, 2011

(65) Prior Publication Data

US 2013/0146444 A1  Jun. 13, 2013

(51) Int. Cl.
| | | |
|---|---|---|
| C23C 14/34 | (2006.01) | |
| H01J 37/34 | (2006.01) | |
| C23C 14/35 | (2006.01) | |
| C23C 14/56 | (2006.01) | |

(52) U.S. Cl.
CPC ............ H01J 37/3405 (2013.01); C23C 14/35 (2013.01); C23C 14/568 (2013.01); H01J 37/345 (2013.01)

(58) Field of Classification Search
CPC ..... H01J 37/3452; H01J 37/345; C23C 14/35
USPC ........................... 204/298.16, 298.19, 298.21
See application file for complete search history.

(56) References Cited

U.S. PATENT DOCUMENTS

| | | | |
|---|---|---|---|
| 5,399,253 A * | 3/1995 | Grunenfelder | 204/298.2 |
| 6,093,293 A * | 7/2000 | Haag et al. | 204/298.12 |
| 7,785,921 B1 | 8/2010 | Juliano et al. | |
| 8,734,619 B1 * | 5/2014 | Corson | 204/192.13 |
| 2005/0109392 A1 | 5/2005 | Hollars | |
| 2005/0178660 A1 * | 8/2005 | Lopp et al. | 204/298.2 |
| 2009/0145746 A1 * | 6/2009 | Hollars | 204/192.25 |
| 2009/0205949 A1 * | 8/2009 | Zueger | 204/192.12 |
| 2010/0018854 A1 * | 1/2010 | McLeod | 204/192.12 |
| 2010/0051454 A1 * | 3/2010 | Akamatsu et al. | 204/298.16 |
| 2012/0175251 A1 * | 7/2012 | Crowley et al. | 204/298.16 |

OTHER PUBLICATIONS

Shidoji, Eiji et al., "An Anomalous Erosion of a Rectangular Magnetron System", J. Vac. Sci. Technol. A, 18(6), Nov./Dec. 2000, pp. 2858-2863.

* cited by examiner

*Primary Examiner* — John Brayton
(74) *Attorney, Agent, or Firm* — The Marbury Law Group PLLC

(57) ABSTRACT

A magnetron include a center plurality of magnets and an outer plurality of magnets arranged around the center plurality of magnets in a shape of two long sections and two shorter turnaround sections. The outer plurality of magnets are configured with at least one region of weaker magnetic field strength in at least one of the two long sections and adjacent to one of the two turnaround sections.

10 Claims, 8 Drawing Sheets

MAGNETRON WITH GRADUALLY INCREASING MAGNETIC FIELD OUT OF TURNAROUNDS

BACKGROUND

Magnetron sputtering is a physical vapor deposition (PVD) method widely used to form thin films on substrates. This method has the advantages of a relatively high deposition rate and the ability to deposit a thin film with relatively high uniformity. However, magnetron sputtering suffers from the disadvantage of a low utilization rate of the target material. The utilization rate of the target material is quite low in cases where the target material is eroded unevenly by local concentrations of magnetron plasma. This uneven erosion has been observed in rectangular magnetrons at the boundary of curved sections (i.e. turnaround) and straight sections. There exists a need to prevent or reduce this uneven erosion and thereby increase the utilization rate of target material in magnetron sputtering.

SUMMARY

Various embodiments include a magnetron including a center plurality of magnets and an outer plurality of magnets arranged around the center plurality of magnets in a shape comprising two long sections and two shorter turnaround sections. The outer plurality of magnets is configured with at least one region of weaker magnetic field strength in at least one of the two long sections and adjacent to a turnaround section.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The various embodiments provide methods and devices that increase the uniformity of erosion of target sputtering material in planar magnetrons. A typical planar magnetron may include a permanent magnet array of magnets arranged in a race track configuration on a yoke or support. The magnet array may be arranged to apply a magnetic field on the face of the target normal to an electric field within a closed path. These fields may form a tunnel of plasma confinement along this path by trapping electrons close to the surface of the target. Trapping electrons may increase the efficiency of sputtering gas ionization within this confinement zone. Sputtering gas ions created by this process may be positively charged and therefore move towards the negatively charged cathode target material located in front (for planar targets) or around (for cylindrical targets) the magnetron. Material may be sputtered from the target surface upon collision.

The sputtering gas may comprise various gases. For example, inert gases, such as argon, are often used because they tend not to react with the target material or other gases. The sputtering gas may be selected to have a high molecular weight to increase sputtering and deposition rates. For reactive sputtering, the sputtering gas may also include a reactive gas or vapor (e.g, Se vapor for CIG sputtering material).

Figure 1:
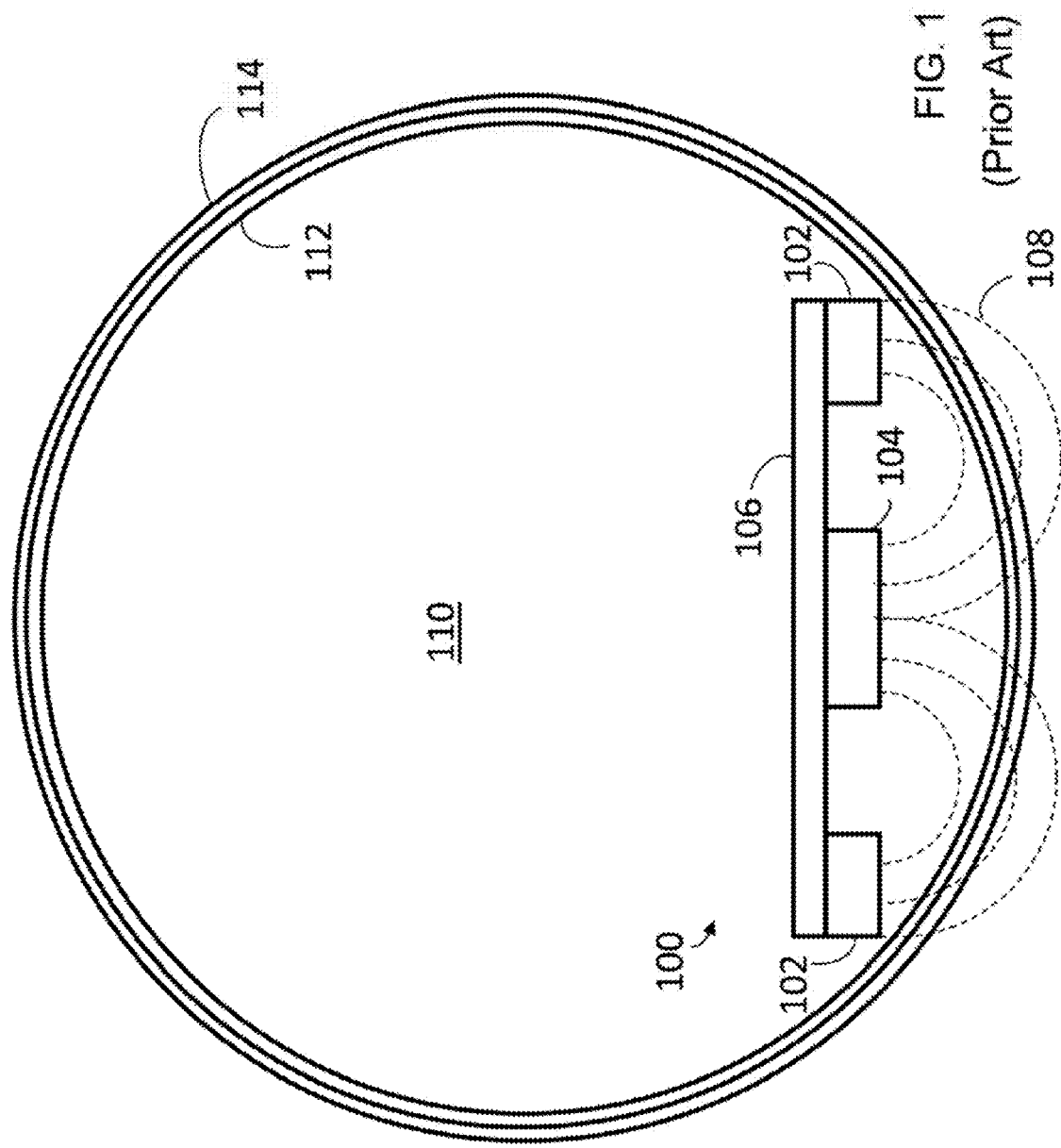
FIG. 1 is a schematic top cross-sectional view of a rectangular magnetron.

The magnetic array and the target material may be arranged in various shapes. The magnetic array is often arranged with an inner magnet of one polarity and surrounding magnets of the opposite polarity. FIG. 1 illustrates a top view of this arrangement in an embodiment magnetron 100. A center magnet or plurality of magnets 104 may be arranged at the center of a yoke 106. An outer magnet or plurality of magnets 102 may be arranged around the center magnet 104. FIG. 1 shows outer magnets 102 on both sides of the center magnet 104. The outer magnets 102 and center magnets 104 may have north poles aligned in opposite directions and thereby result in a magnetic field 108 as shown in FIG. 1. The magnetic field 108 from these magnets 102 and 104 may indicate how the plasma zone will be shaped during operation. As shown in FIG. 1, the magnetron 100 may be located in the inner space 110 of a hollow cylindrical target backing tube 112. A sputtering material 114 (e.g., metal, semiconductor, insulator, etc.) is located on the outer surface of the tube 112 such that field 108 crosses the material 114. Alternately, a magnetron may be located adjacent to a planar target (not shown).

Figure 2A:
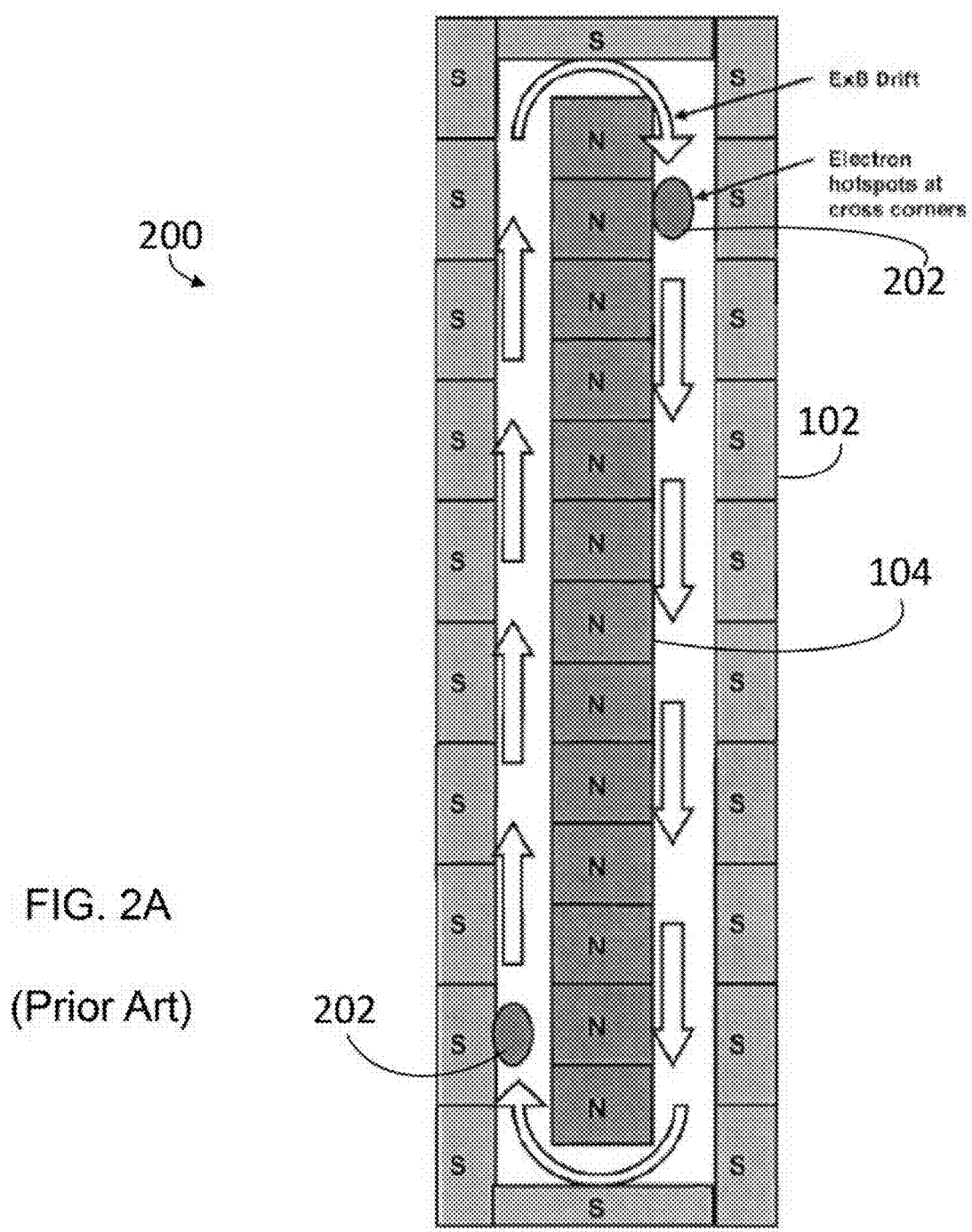
FIG. 2A is a schematic side view of a prior art rectangular magnetron showing typical electron hotspots.

FIG. 2A is a side view of a rectangular magnetic array 200. The center magnets 104 may be arranged in a row. The outer magnets 102 may be arranged in a rectangle or "race track" around the row of center magnets 104. Rectangular shaped magnets and arrangements are shown and discussed as an example, but various embodiments may include alternate shapes and arrangements of magnets 102 and 104. Each magnet may comprise any suitable magnetic material, such as SmCo or NdFeB permanent magnets.

The center magnets 104 and outer magnets 102 may be opposite in polarity. For example, FIG. 2A illustrates the center magnets 104 with north poles aligned upward and the outer magnets 102 with south poles aligned upward.

Other features of the magnet array 200 may differ between various embodiments. For example, in various embodiments, the center magnets 104 and outer magnets 102 may rest on a yoke, such as an iron yoke 106 shown in FIG. 1.

FIG. 2A also illustrates the path of trapped electrons within the plasma zone with arrows. The electrons may travel in a circuitous path or "race track" as it is often called. This path travels along the long sides of the rectangular magnet array and around the "turnarounds" at the short sides. In various embodiments, electrons may travel around the race track clockwise or counterclockwise depending on the orientation of the magnetic poles. For example, the electrons are shown traveling clockwise in FIG. 2A when the center magnets 104 have north poles aligned upward and the outer magnets have south poles aligned upward. The electrons may not travel directly between the magnets, but rather in the plasma zone, which may be over the target sputtering material 114 as shown in FIG. 1.

Rectangular magnetic arrays often suffer from uneven target erosion. Specifically, increased electron density at electron "hot spots" may lead to increased target erosion at these areas. Hot spots are often the result of sharp changes in the strength of the magnetic field. Larger changes may lead to worse hot spots. As shown in FIG. 2A, electron hot spots 202 are often located where electrons leave the magnetron's turnarounds. For example, because the electrons are traveling clockwise, hot spots 202 are located in the upper right corner and the lower left corner. This phenomenon is called the cross corner effect, or CCE, because the hot spots and subsequent erosion occurs at opposite corners of the target corresponding to the same locations on the magnetron. The increased electron density is caused by an increase in the magnetic field strength experienced by electrons coming out of the turnarounds. This increase in magnetic field strength may cause the ExB drift velocity of the electrons to decrease. As a result of decreased ExB drift velocity, electrons may slow and cluster into CCE hot spots 202.

Various embodiments involve different configurations of outer magnets 102 of varying strength and relative location, but typically the outer magnets 102 on the long sides of the rectangle may be the same size and strength and may be packed tightly together. Outer magnets on the short sides may be the same strength as the magnets on the long sides. Alternately, the short side magnets may be weaker to reduce erosion grooves that may form in the cathode target 106 at the turnarounds of the race track. However, weaker short side magnets can increase the difference in magnetic field strength between the short and long sides and exacerbate the cross corner effect.

Figure 2B:
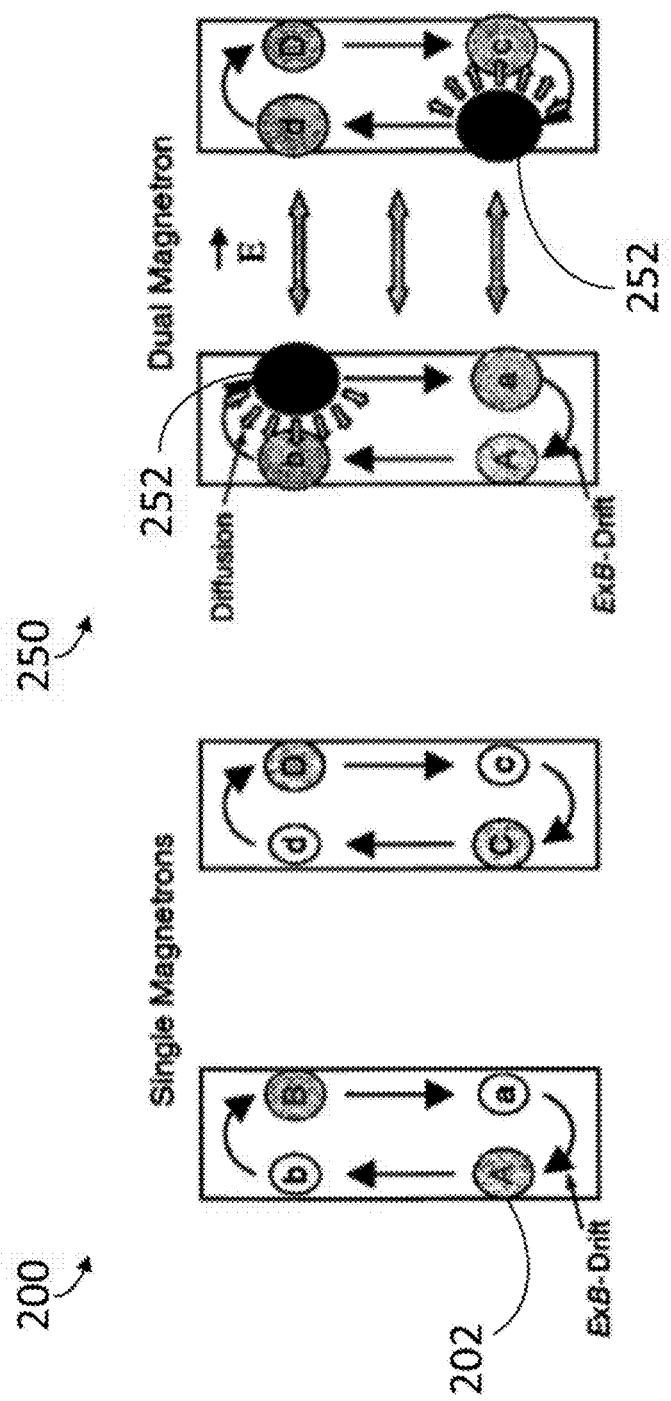
FIG. 2B is a schematic side view of separate prior art rectangular magnetrons and dual rectangular magnetrons.

Magnetrons may be operated in conjunction with other magnetrons. For example, AC paired magnetrons may include two side by side targets that alternately act as anode and cathode for each other. These magnetrons may interact with one another in what is called the cross magnetron effect, or CME. FIG. 2B (reproduced from page 346 of *Reactive Sputter Deposition* by Diederik Depla and Stijn Mahieu) illustrates this effect. Single magnet array magnetrons 200 operated separately or powered in parallel are shown to the left in FIG. 2B with hot spots 202 similar to those shown in FIG. 2A. However, if the electric fields of the magnetrons interact, such as with the dual magnetrons 250, the hot spots may be different. As shown to the right in FIG. 2B, new CME hot spots 252 may develop as electron density is generally increased along the shared side (i.e., adjacent sides) of the dual magnetrons 250. CME hot spots 252 may have greater electron density and lead to even worse uneven erosion of the targets than normal CCE hot spots 202.

Various embodiments may increase the uniformity of erosion of target sputtering material in planar magnetrons by adjusting the strength of the magnetic field. In particular, various embodiments may include one or more transition regions with a weaker magnetic field strength in a magnet array. For example, various embodiments may include planar magnetrons with regions of relatively high magnetic field strength in the turnarounds and portions of the long sides and regions of relatively low magnetic field strength in the remaining portions of the long sides. The transition regions of relatively low magnetic field strength may be positioned adjacent to turnarounds, such as where electrons traveling in the race track would exit from the turnarounds. In further embodiments, a region of weaker magnetic field strength may be configured such that magnetic field strength gradually shifts across the region, such as moving from weak to strong along the length of the long side and away from an adjacent turnaround.

Figure 3A:
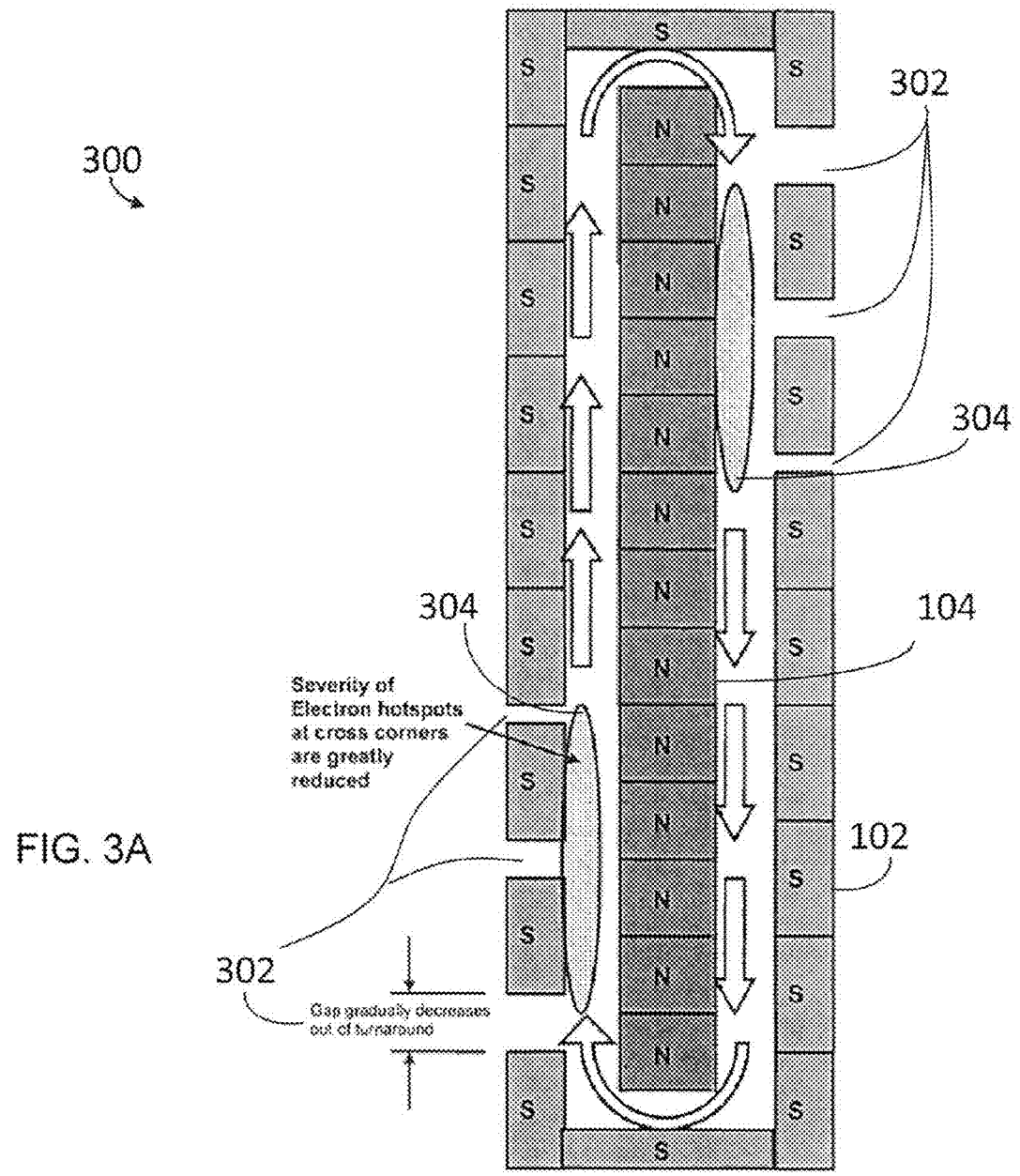
FIG. 3A is a schematic side view of an embodiment rectangular magnetron with spaced magnets showing electron hotspots of reduced severity.

FIG. 3A illustrates an embodiment magnet array 300. A plurality of center magnets 104 may be arranged in a row with a plurality of outer magnets 102 arranged around the center magnets 104. The outer magnets 102 may be arranged to define a plurality of gaps 302. These gaps 302 may be empty or filled with various spacers or shims which are non-magnetic. In embodiments with multiple gaps 302, the gaps 302 may decrease in size (e.g., size in the dimension parallel to the length of the long side of the magnet array) further away from the turnaround (e.g., the short side) as shown in FIG. 3A. By including a plurality of gaps, the magnetic field may include a transition region of increasing magnetic field strength rather than a sharp jump. This transition region may allow electrons traveling in the race track to gradually accelerate. The resulting hot spots 304 may be less severe and spread out as shown in FIG. 3A. Therefore, these gaps may also mitigate the cross corner and cross magnetron effects and thereby increase the utilization rate and erosion uniformity of the target material.

Figure 3B:
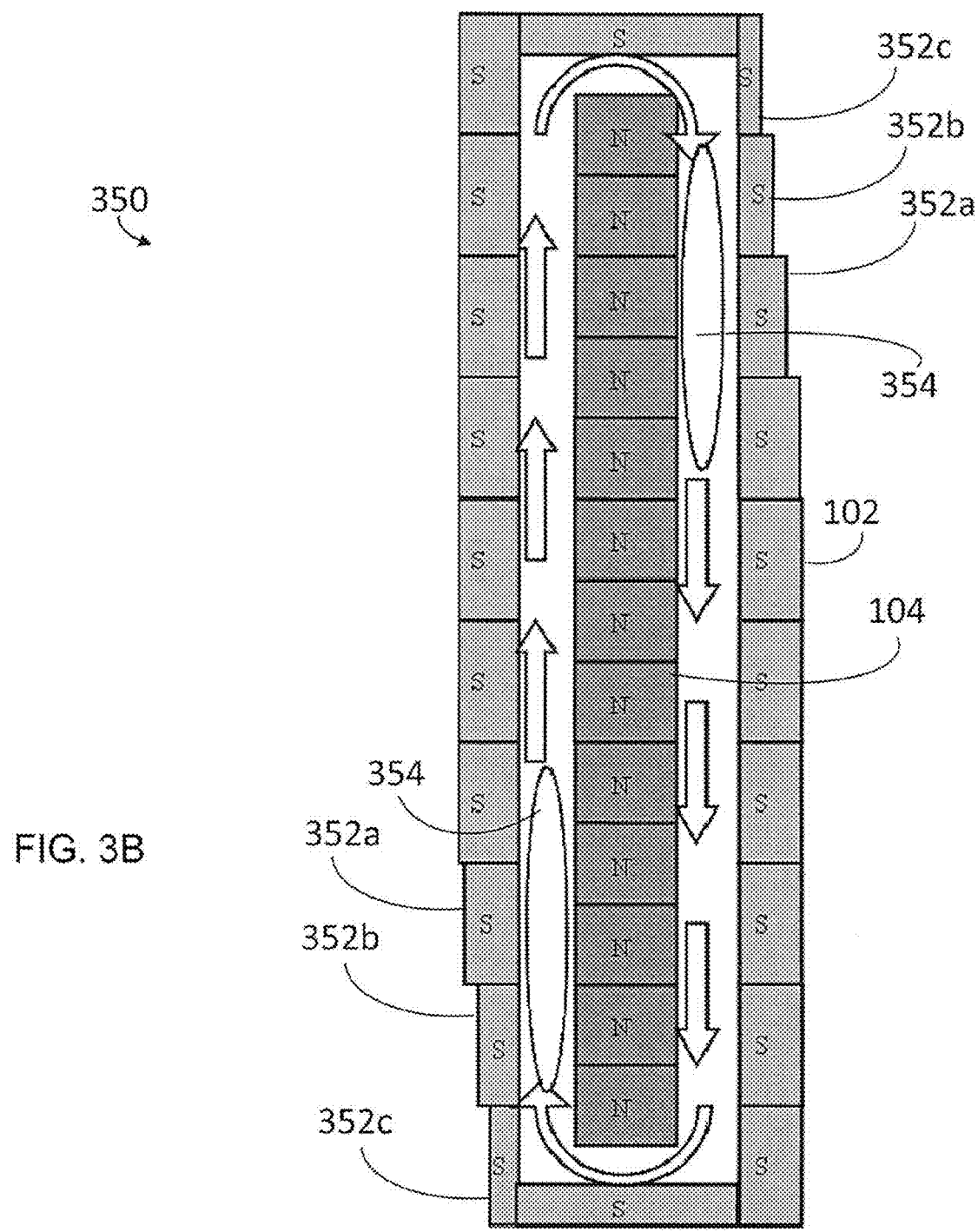
FIG. 3B is a schematic side view of an embodiment rectangular magnetron with varying thickness magnets showing electron hotspots of reduced severity.

FIG. 3B illustrates an alternate embodiment magnet array 350. This array 350 may also include a plurality of center magnets 104 arranged in a row with a plurality of outer magnets 102 arranged around the center magnets 104. The outer magnets 102 may include a plurality of magnets of varying widths 352a, 352b, 352c in the long sides where electrons would exit the turnaround. As shown in FIG. 3B, the magnets of varying width 352a, 352b, 352c may be arranged with the thinner magnets closest to the turnaround and wider magnets closer to the other outer magnets 102. Varying the width of magnets in this manner may provide a transition region of gradually increasing magnetic field strength that results in less severe hot spots 354 and mitigates the cross corner and cross magnetron effects similar to the array of FIG. 3A.

Figure 4:
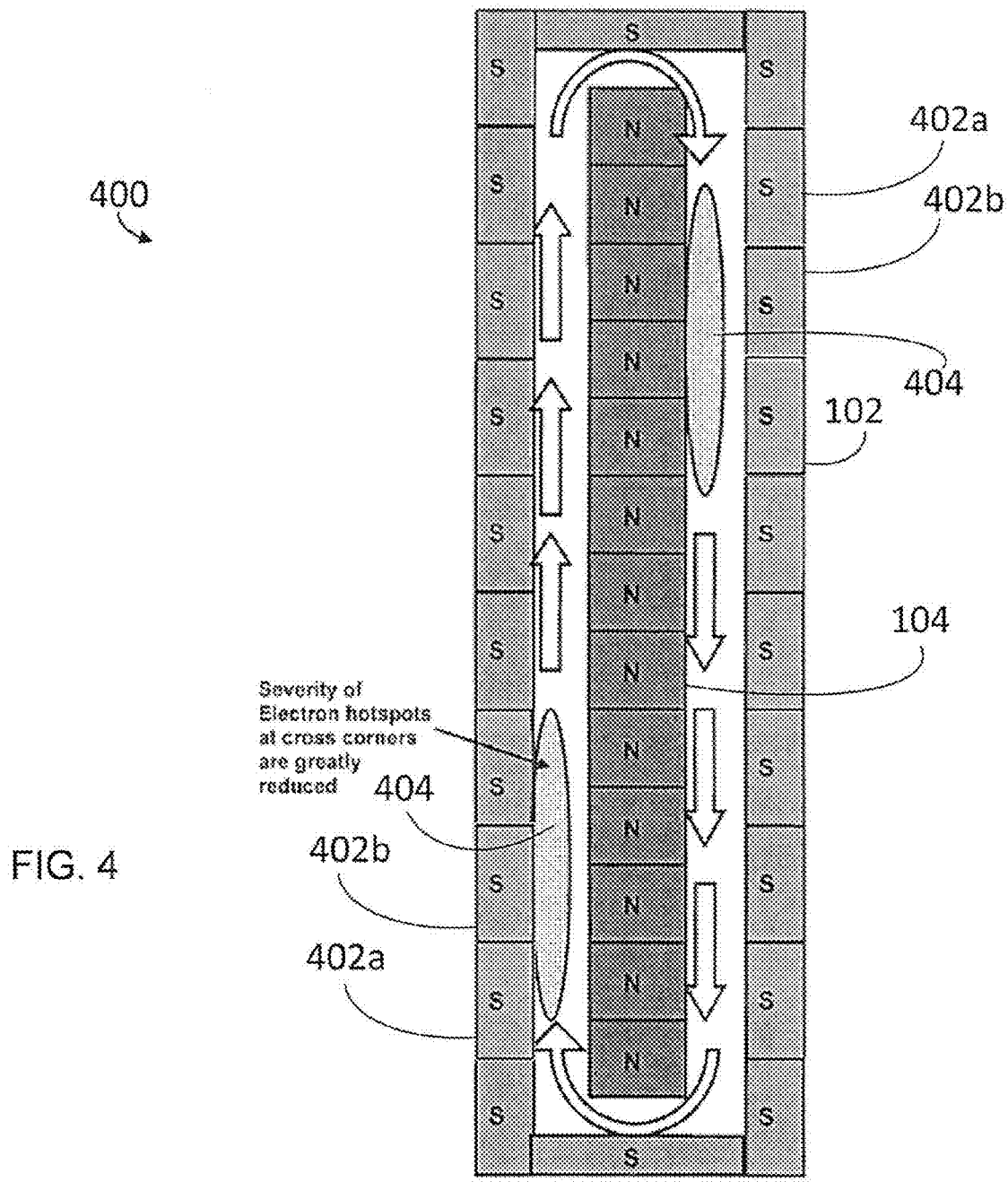
FIG. 4 is a schematic side view of an embodiment rectangular magnetron with magnets of varied strength showing electron hotspots of reduced severity.

FIG. 4 illustrates another embodiment magnet array 400. Similar to the magnet array 300 of FIG. 3A, center magnets 104 may be arranged in a row with outer magnets 102 arranged around the center magnets 104. The outer magnets 102 may include a plurality of weaker magnets 402a and 402b in the long sides where electrons would exit the turnaround. These weaker magnets 402a and 402b may vary in strength such as increasing in strength further from the turnaround. For example, magnets 402b may be stronger than magnets 402a but not as strong as the other outer magnets 102. The weaker magnets 402a and 402b may provide a transition region. This transition region of gradually increasing magnetic field strength may minimize electron density and lead to spread out or less severe hot spots 404. Similar to the gaps 302 of FIG. 3A, a plurality of weaker magnets 402 may mitigate the cross corner and cross magnetron effects and thereby increase the utilization rate and erosion uniformity of the target material.

Further embodiments may include other configurations of magnets or spacers in a transition region. For example, various embodiments may include magnet arrays similar to magnet array 300 except that spacing magnets of lower magnetic field strength may be used rather than spacers or shims in the transition region. In further embodiments, these spacing magnets may vary in strength or size. For example, the transition region may include alternating weaker spacing magnets and stronger "regular" magnets that are found in the rest of the longer sides and turn around regions. For example, there may be one or more weak spacing magnets interspersed between every other or every few strong magnets in the transition region. The weak spacing magnets may vary in size or strength such that larger or weaker magnets spacing magnets are closer to the turnaround than smaller or stronger spacing magnets. Thus, progressively larger and/or weaker spacing magnets may be located in the transition region from the turn around region to the middle of one of the longer sides.

Figure 5:
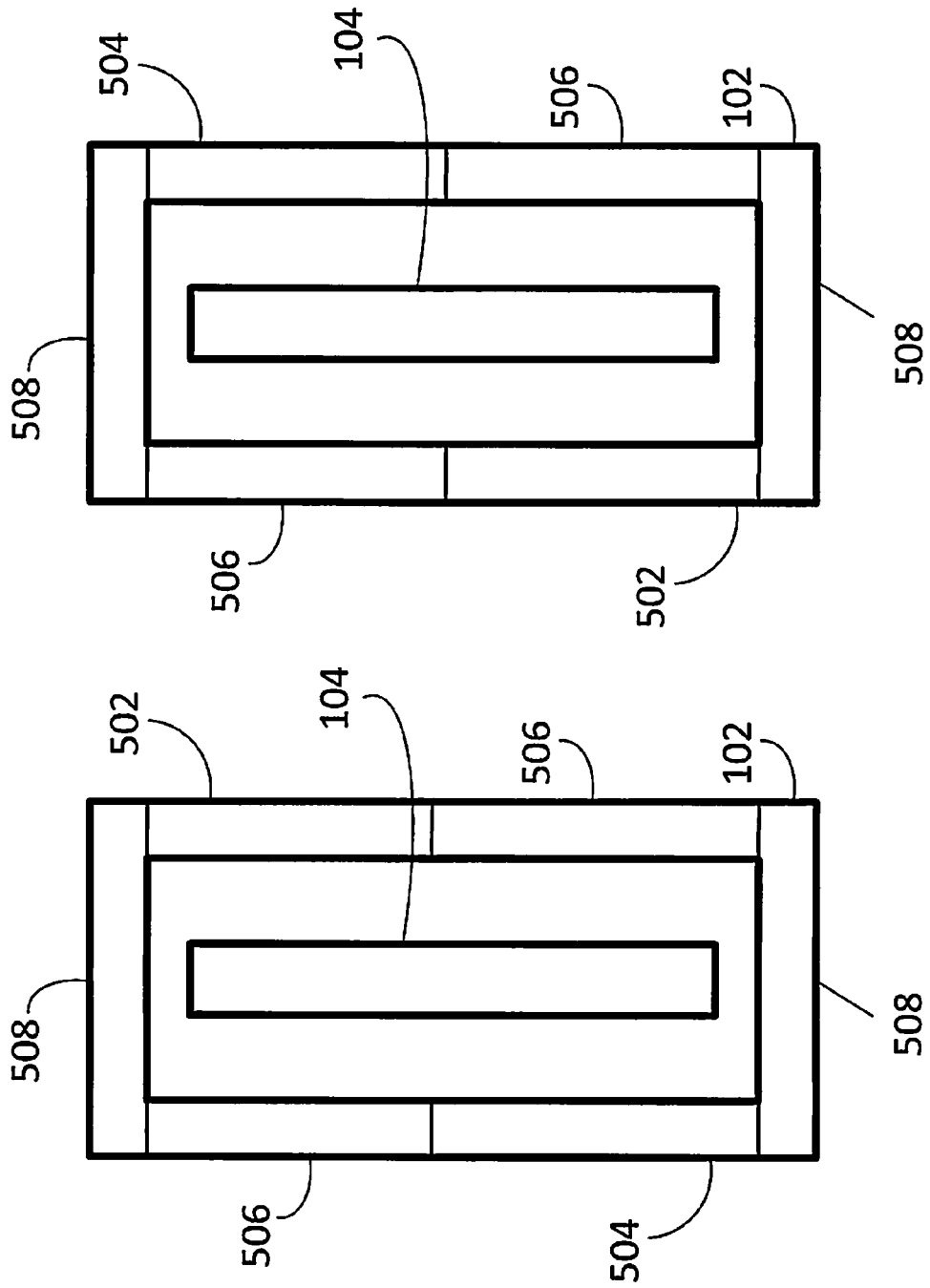
FIG. 5 is schematic diagram of embodiment dual rectangular magnetrons with different transition regions.

Various embodiments may combine the previously discussed embodiment magnet arrays into dual magnetrons. FIG. 5 illustrates an embodiment dual magnetron arrangement. Center magnets 104 may be surrounded by outer magnets 102. The outer magnets 102 may include several regions of varying magnetic field strength. For example, the turnaround portions 508 may have one level of magnetic field strength. As with the previously discussed embodiments, the long sides may include transition regions of lower magnetic field strength. These regions may be positioned where electrons would exit the turnaround. If electrons would rotate clockwise, then these regions may be in the upper right and lower left corners as shown. However, to mitigate or avoid the cross magnetron effect shown in FIG. 2B, these regions may have different magnetic field strengths. For example, interior transition regions 502 (e.g. the transition regions on each magnetron facing the other magnetron) may have a different (e.g., lower) magnetic field strength than the outer transition regions 504 in each magnetron (e.g., the transition regions on each magnetron facing away from the other magnetron). The remaining portions of the long sides, regions 506, may be stronger than the transition regions 502 or 504. The regions 506 may be the same magnetic field strength as the turnaround portions 508 or a different strength.

Figure 6:
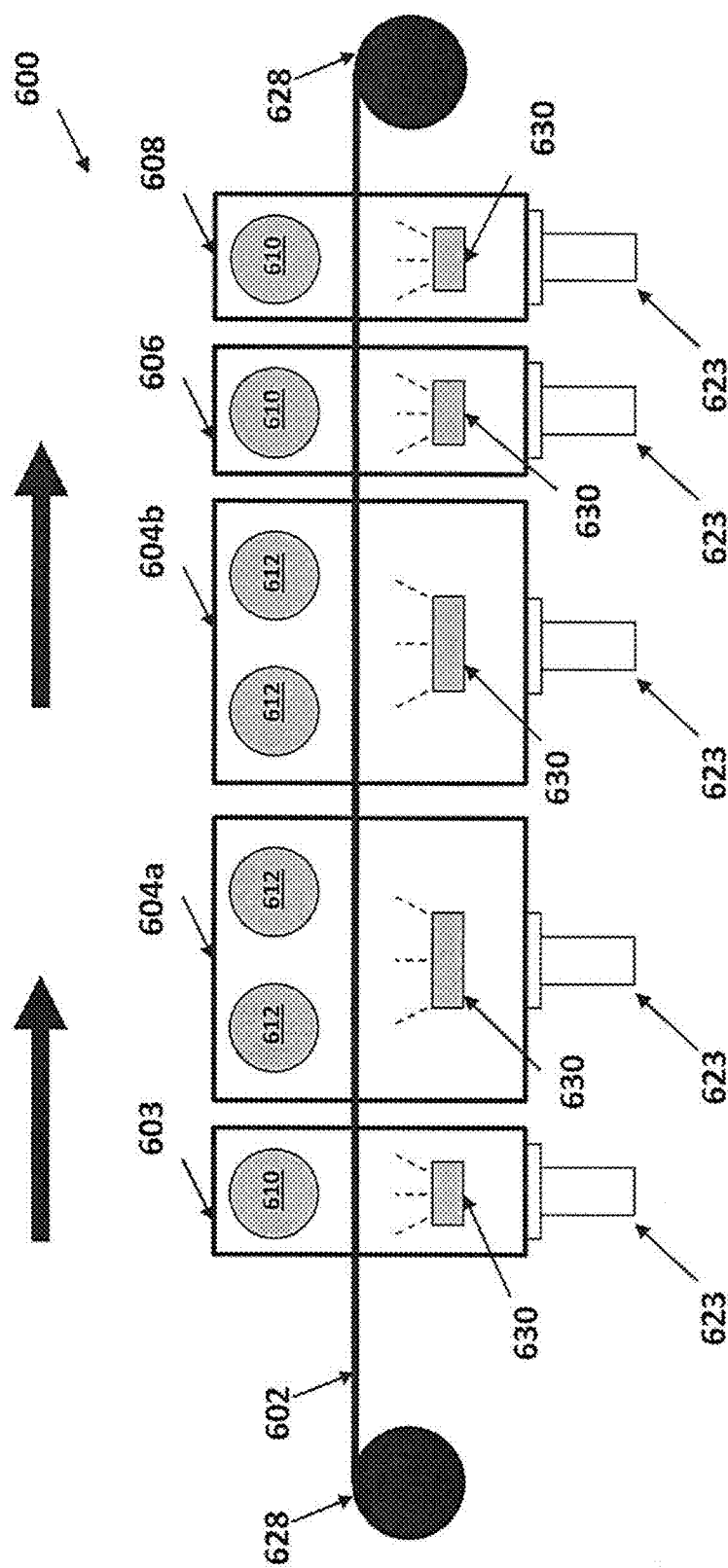
FIG. 6 is a schematic diagram of a sputtering device that may incorporate embodiment magnetrons.

Various embodiments may include single or dual magnetrons as described above incorporated into sputtering systems or devices. FIG. 6 illustrates an embodiment sputtering system 600 including single and dual embodiment magnetrons that may be used to manufacture solar cells. A substrate 602 may be continuously passing through the sputtering apparatus 600 during the sputtering process, moving left to right in the direction of the imaginary arrows above.

The sputtering apparatus 600 may include several process modules 603, 604a, 604b, 606, and 608. The number of process modules may be varied to match the requirements of the device that is being produced. Each module may have a pumping device 623, such as a vacuum pump, for example a high throughput turbomolecular pump, to provide the required vacuum and to handle the flow of process gases during the sputtering operation. Each module may have a number of pumps placed at other locations selected to provide optimum pumping of process gases. The modules may be connected together at slit valves, which contain very narrow low conductance isolation slots to prevent process gases from mixing between modules. These slots may be separately pumped if required to increase the isolation even further. Other module connectors may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

Each of the process modules 603, 604a, 604b, 606, and 608 may include one or more sputtering targets 610. The sputtering targets 610 may be planar or rotary sputtering targets. These targets may be mounted on any of the embodiment magnetrons discussed above.

Sputtering targets 612 may be mounted on dual magnetrons as shown in module 604a and 604b. These dual magnetrons may be any of the dual magnetrons or any combination of the single magnetrons previously discussed.

The substrate 602 may be moved throughout the machine by rollers 628, or other devices. Additional guide rollers may be used. Some rollers may be bowed to spread the web, some may move to provide web steering, some may provide web tension feedback to servo controllers, and others may be mere idlers to run the web in desired positions.

Heater arrays 630 may be placed in locations where necessary to provide web heating depending upon process requirements. These heaters 630 may be a matrix of high temperature quartz lamps and/or resistance heaters laid out across the width of the web. Infrared sensors may provide a feedback signal to adjust the lamp power and provide uniform heating across the web.

The substrate 602 may be prepared in various ways prior to sputtering, for example by cleaning or preheating. Once the substrate 602 is ready, it may pass into the first process module 603 and continue through the remaining modules. The substrate 602 may pass out of the final process module and may be either wound onto a take up spool or sliced into solar cell strings.

Further embodiments may be used in sputtering systems used to create thin film solar cells of various materials, such as CIS or CIGS thin film solar cells. Embodiment methods for making a solar cell may include steps of sputtering a layer of material with a sputtering device using any of the previously discussed embodiment magnetrons. Examples of systems and methods for sputtering CIS or CIGS solar cells that may use single or dual magnetron embodiments are shown in U.S. Pat. No. 7,785,921 to Juliano et al., issued on Aug. 31, 2010, which is incorporated herein by reference in its entirety.

For example, the web 602 may be provided into an optional initial module 603 to sputter deposit a barrier layer (e.g., Mo or Cr) on the front of the web and/or a protective layer (e.g., molybdenum-oxygen alloy) on the back of the web using target 610 containing the magnetron described above.

The web then passes into the process modules 604a-608 through a valve. Following the direction of the imaginary arrows along the web 602, the full stack of layers may be deposited in one continuous process. The first electrode may be sputtered in the process module 604a over the web 602, as illustrated in FIG. 6. Optionally, the process module 604a may include more than one target, for example a first alkali-containing transition metal target 612 and a second alkali-containing transition metal target 612, arranged in such a way that each alkali-containing transition metal target has a composition different from that of the transition metal target. The targets 612 may contain a sodium molybdate, a molybdenum-oxygen alloy or molybdenum sputtering material on a rotary cylindrical backing tube containing the magnetron described above inside the backing tube.

The web 602 then passes into the next process module, 604b, for deposition of the at least one p-type semiconductor absorber layer, such as a CIGS layer. In a preferred embodiment shown in FIG. 6, the step of depositing the at least one p-type semiconductor absorber layer includes reactively alternating current (AC) magnetron sputtering the semiconductor absorber layer from at least one pair of two conductive targets 612 in a sputtering atmosphere that comprises argon gas and a selenium-containing gas. In some embodiment, the pair of two conductive targets 612 comprise the same targets. For example, each of the at least two conductive targets comprises copper, indium and gallium, or comprises copper, indium and aluminum. The selenium-containing gas may be hydrogen selenide or selenium vapor. In other embodiments, targets may comprise different materials from each other. The radiation heaters 30 maintain the web at the required process temperature, for example, around 400-800° C., for example around 500-700° C., which is preferable for the CIGS layer deposition. The targets 612 may contain the CIG sputtering material on a rotary cylindrical backing tube containing the magnetron described above inside the backing tube.

The web 602 may then pass into the process modules 606 and 608, for depositing the n-type semiconductor layer (e.g., n-CdS), and the transparent top electrode (e.g., ITO, ZnO, AZO and/or resistive AZO, respectively. Any suitable type of sputtering sources may be used, for example, rotating AC magnetrons, RF magnetrons, or planar magnetrons, as described above. Extra magnetron stations (not shown), or extra process modules (not shown) could be added for sputtering the optional one or more Anti-Reflection (AR) layers.

It is to be understood that the present invention is not limited to the embodiments and the examples described above and illustrated herein, but encompasses any and all variations falling within the scope of the appended claims. The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the scope of the invention. Thus, the present invention is not intended to be limited to the embodiments shown herein but is to be accorded the widest scope consistent with the principles and novel features disclosed herein.

The invention claimed is:

1. A magnetron, comprising a plasma zone located between a center plurality of magnets and an outer plurality of magnets, wherein:
   the plasma zone has an area defined by an area outside of an inner perimeter and inside of an outer perimeter;
   the inner perimeter is defined by edges overlapping with sidewalls of the center plurality of magnets, an entirety of the center plurality of magnets being configured with north poles pointing toward a same direction;
   the outer perimeter is defined by a set of sides that overlap with inner sidewalls of the outer plurality of magnets which are arranged around the center plurality of magnets in a shape comprising two long sections extending along a lengthwise direction and two shorter turnaround sections that are adjoined at four corners of the outer perimeter of the plasma zone;
   the outer plurality of magnets are configured with regions of high magnetic field strength and at least one region of weaker magnetic field strength;
   the at least one region of weaker magnetic field strength is located within at least one of the two long sections and adjacent to a turnaround section;
   the regions of high magnetic field strength are located within each of the two shorter turnaround sections and remainder portions of the two long sections that are not the at least one region of weaker magnetic field strength;
   a transition region is present within each section of the plasma zone that is adjacent to a region of weaker magnetic field and located between a respective pair of regions of high magnetic field strength; and
   magnetic field strength increases within each transition region of the plasma zone as a function of a distance that is measured away from an adjacent shorter turnaround section and along the lengthwise direction of the long sections from a first end of the transition region that is proximal to the adjacent shorter turnaround region up to a second end of the transition region that is distal from the adjacent shorter turnaround section,
   wherein the at least one region of weaker magnetic field strength comprises magnets arranged to define a plurality of gaps, each gap between adjacent magnets, the gaps being of different sizes, with each gap size decreasing with a distance away from the adjacent shorter turnaround section.

2. The magnetron of claim 1, wherein the outer plurality of magnets are configured with north poles in a first direction, the center plurality of magnets are configured with north poles in a second direction opposite of the first direction, and the at least one region of weaker magnetic field strength is located based on the first and second direction.

3. The magnetron of claim 1, wherein the outer plurality of magnets is arranged in a rectangle, the two long sections are two long sides of the rectangle, and the two turnaround sections are short sides of the rectangle.

4. The magnetron of claim 1, the at least one region of weaker magnetic field strength comprises alternated magnets of different strengths.

5. The magnetron of claim 1, wherein the magnetron is located adjacent to a planar target.

6. The magnetron of claim 1, wherein the magnetron is located inside a cylindrical backing tube of a cylindrical target.

7. The magnetron of claim 6, wherein the backing tube contains a molybdenum alloy or a copper indium gallium alloy sputtering material on its outer surface.

8. The magnetron of claim 1, wherein an entirety of each region of the plasma zone between the center plurality of magnets and one of the two long sections of the outer plurality of magnets has a uniform width throughout.

9. The magnetron of claim 1, wherein the outer perimeter is an outer rectangular perimeter that consists of four edges that coincide with inner sidewalls of two long sections and inner sidewalls of the two shorter turnaround sections.

10. The magnetron of claim 9, wherein the inner perimeter is an inner rectangular perimeter that consists of four edges that coincide with the sidewalls of the center plurality of magnets.

* * * * *